United States Patent

Sawada

[11] Patent Number: 6,000,843
[45] Date of Patent: Dec. 14, 1999

[54] ELECTRICALLY ALTERABLE NONVOLATILE SEMICONDUCTOR MEMORY

[75] Inventor: Kikuzo Sawada, Sagamihara, Japan

[73] Assignee: Nippon Steel Corporation, Tokyo, Japan

[21] Appl. No.: 08/813,300

[22] Filed: Mar. 10, 1997

Related U.S. Application Data

[63] Continuation of application No. 08/559,893, Nov. 20, 1995, abandoned, which is a continuation of application No. 08/084,961, Jul. 2, 1993, abandoned.

[30] Foreign Application Priority Data

Jul. 3, 1992 [JP] Japan .................................. 4-200242

[51] Int. Cl.$^6$ .................................................. G06F 11/00
[52] U.S. Cl. ........................ 371/21.4; 365/201; 365/218
[58] Field of Search .............................. 371/21.4, 21.1; 365/201, 185.29, 185.33, 184, 218, 185.18; 324/158.1

[56] References Cited

U.S. PATENT DOCUMENTS

| | | | |
|---|---|---|---|
| 3,795,859 | 3/1974 | Benante et al. | 324/73 R |
| 4,160,291 | 7/1979 | Smith et al. | 365/203 |
| 4,243,937 | 1/1981 | Multani | 324/765 |
| 4,279,024 | 7/1981 | Schrenk | 365/203 |
| 4,519,076 | 5/1985 | Priel | 371/21 |
| 4,575,823 | 3/1986 | Fitzpatrick | 365/184 |
| 4,733,394 | 3/1988 | Giebel | 371/21.1 |
| 4,809,227 | 2/1989 | Suzuki et al. | 365/168 |
| 4,963,825 | 10/1990 | Mielke | 324/158 R |
| 4,964,079 | 10/1990 | Devin | 365/168 |
| 4,967,394 | 10/1990 | Minagawa | 365/201 |
| 5,012,445 | 4/1991 | Kazuaki et al. | 365/189.06 |
| 5,109,257 | 4/1992 | Kondo | 357/23.5 |
| 5,195,057 | 3/1993 | Kasa et al. | 365/200 |
| 5,253,206 | 10/1993 | Tahaka et al. | 365/189.09 |
| 5,394,362 | 2/1995 | Banks | 365/189.01 |

FOREIGN PATENT DOCUMENTS 63-291475 of 0000 Japan .

OTHER PUBLICATIONS

Reliability Aspect of a Floating Gate EEPROM, 1981. IEEE/Proc. IRPS pp. 11–16.
A 90ns, One–Million Erase/Program cycle I–Mbit Flash Memory. IEEE Journal of Solid State Circuit 1989, Oct., vol. 24, No. 5.
Technical Trend of EPROM, May 10, 1990 Denpa Shimbun special edition Japan.

Primary Examiner—Dieu-Minh Le
Attorney, Agent, or Firm—Pollock, Vande, Sande & Armernick

[57] ABSTRACT

An electrically alterable nonvolatile semiconductor memory device has a first memory array including a plurality of first memory cells and a second memory array including at least one second memory cell, wherein contents of the first memory array and contents of the second memory array are capable of being altered independently of each other and variation of a specific quality of each second memory cell due to altering of the contents of the second memory cell is examined, in order to estimate the life of the first memory array.

30 Claims, 7 Drawing Sheets

ELECTRICALLY ALTERABLE NONVOLATILE SEMICONDUCTOR MEMORY

This application is a Continuation of U.S. patent application Ser. No. 08/559,893, filed Nov. 20, 1995, now abandoned, which is a Continuation of U.S. patent application Ser. No. 08/084,961, filed Jul. 2, 1993, now abandoned.

BACKGROUND OF THE INVENTION

1. Field of the Invention

This invention relates to electrically alterable nonvolatile semiconductor memories, and particularly to a semiconductor memory having means for examining a specific quality of memory cells which constitute the semiconductor memory.

2. Description of the Related Art

The published technical documents relating to this invention are:

Document 1; Reliability Aspect of a Floating Gate EEPROM, 1981, IEEE/Proc. IRPS P11–P16

Document 2; A 90 ns One-Million Erase/Program Cycle 1-Mbit Flash Memory, IEEE Journal of Solid-State Circuit, October, 1989, vol. 24, No. 5

Document 3; Technical Trend of EEPROM, May 10, 1990, Denpa Shimbun, Special Edition, Japan Document 4; JP-A-63-291475

Many documents on the electrically alterable and nonvolatile, semiconductor memory (hereinafter, referred to as EEPROM) whose stored information is not lost when the power to the memory is turned off, have recently been published. In a method of holding the stored information even when the power to the memory is turned off, as described in the above-documents, a polysilicon layer (hereinafter, referred to as floating gate), which is electrically insulated when reading, is formed on a thin oxide film that is formed on a silicon substrate, and electrons or holes are injected into this floating gate when writing, thereby accumulating charges thereon.

To read information, a voltage is applied to a polysilicon electrode formed on the floating gate with an insulating film interposed therebetween. At this time, the information is judged depending on whether a current flows or not between the source electrode and the drain electrode which are formed adjacent to the thin oxide film. When many electrons are accumulated on the floating gate, no current flows, but otherwise, a current flows between the drain and source electrodes.

To write information, as shown, for example, in Document 1, a positive high voltage (for example, 15 through 20 V (volts)) is applied to the polysilicon electrode, and the drain electrode is grounded. Thus, a high electric field is produced at both ends of the thin oxide film so that electrons are injected into the floating gate by the principle of indirect tunneling. In addition, to extract electrons from the floating gate, a high voltage is applied to, for example, the drain terminal with the polysilicon electrode grounded, thus causing electrons to be discharged to the drain terminal.

In another method for writing information, as described in Document 2, a positive high voltage (for example, about 10 V (volts)) is applied to the polysilicon electrode, and also a positive voltage (for example, 5 V through 10 V) is applied to the drain electrode. Thus, electrons are injected into the floating gate by the mechanism of channel hot electron injection. In this method, the extraction of electrons is performed by the principle of indirect tunneling as in Document 1, in such a manner that a high voltage is applied to the source terminal thereby extracting electrons from the floating gate to the source terminal.

The contents of the memory are electrically altered by any method as mentioned above. In this case, since electrons and holes are passed through the thin oxide film during injection of electrons, the quality of the oxide film is deteriorated so that the electric charges accumulated on the floating gate may escape after writing as described in the above documents. The deterioration of the memory is caused by electrically altering its contents, and thus limits the number of times by which the memory elements (hereinafter, referred to as the memory cells) of EEPROM can be electrically altered without deterioration. The possible number of altering times is generally between ten thousand times and one million times per cell. The time necessary to electrically alter is about from one to 10 msec (milliseconds) for tunnel injection or about from one to 100 $\mu$s (microseconds) for hot electron injection.

The degree of the deterioration depends most greatly on the quality of the thin oxide film, and relatively largely on the deviation in the manufacturing process. Since the deterioration of a memory cell is caused by the electrical altering of its contents, the degree of the deterioration of a memory cell cannot be precisely predicted before using the memory cell, and thus the possible number of times of altering of its contents cannot be estimated.

In the conventional EEPROM, to assure the possible number of times by which the memory cells can be electrically altered, the altering test is performed for each product before the actual shipping. On the basis of the test results, the degree of the deterioration is examined and the defective products are removed. This is described in, for example, Document 3. The test is applied to the memory cell which is actually to be used by the user. The altering test for each cell is made, for example, several hundred times through several thousand times.

As the memory capacity of the EEPROM increases, the time required for applying the altering test to all the memory cells which are to be used by the user before shipping becomes longer, resulting in increasing the product cost. As described in, for example, Document 2, it takes about 900 seconds to erase a one-megabit EEPROM 1000 times. The altering test for each memory cell before shipping decreases the remaining possible number of times of altering since each memory cell has a limited number of altering times.

In a semiconductor memory as disclosed in Document 4, an array of monitoring memory cells is added to the main memory cell array which is actually used for storing data, in order that a user can know the degree of deterioration of the main memory cell array before it is completely deteriorated. The possible number of times by which the monitoring cells can be altered, or its life is artificially made shorter than that of the main memory cells, for example, 80%, so that it is expected that when the life of monitoring cells have expired, the remaining life of the main memory cells is about 20%. However, although the user can be informed that the remaining life of the memory is short, it is not concerned with the prediction of the quality of the memory relating to the possible number of times of altering before it is actually used by a user.

SUMMARY OF THE INVENTION

Accordingly, it is an object of the invention to provide an electrically alterable semiconductor memory, for which a specific quality such as the possible number of times of altering can be predicted in a short time without degrading the specific quality.

According to the invention, an electrically alterable nonvolatile semiconductor memory comprises electrically alterable nonvolatile first memory means including a plurality of first memory cells each having substantially the same specific quality, electrically alterable nonvolatile second memory means including one or more second memory cells, the number of which is less than that of the first memory cells, each of the second memory cells being expected to have substantially the same specific quality as that of each first memory cell, means for electrically altering contents of the second memory means independently of altering contents of the first memory means, and means for examining variation of the specific quality of each of the second memory cells caused by altering the contents of the second memory means.

In the nonvolatile semiconductor memory of the invention, the second memory means including one or more second memory cells is provided, in addition to the first memory means including a plurality of first memory cells, such that a number of the second memory cells is less than that of the first memory cells, each of the second memory cells has substantially the same specific quality as that of each first memory cell and variation of the specific quality of each second memory cell due to altering of the contents of the second memory means is examined, whereby variation of the specific quality of each first memory cell due to altering of contents of the first memory means can be predicted based on the results of examination of the second memory cells. Therefore, it is unnecessary to directly examine variation of the specific quality of the first memory means due to altering of its contents. Further, it is possible to reduce the time required for examination of variation of the specific quality of the second memory means by altering contents of the second memory means under a condition that the variation of the specific quality is accelerated.

DESCRIPTION OF THE PREFERRED EMBODIMENTS

Figure 1A:
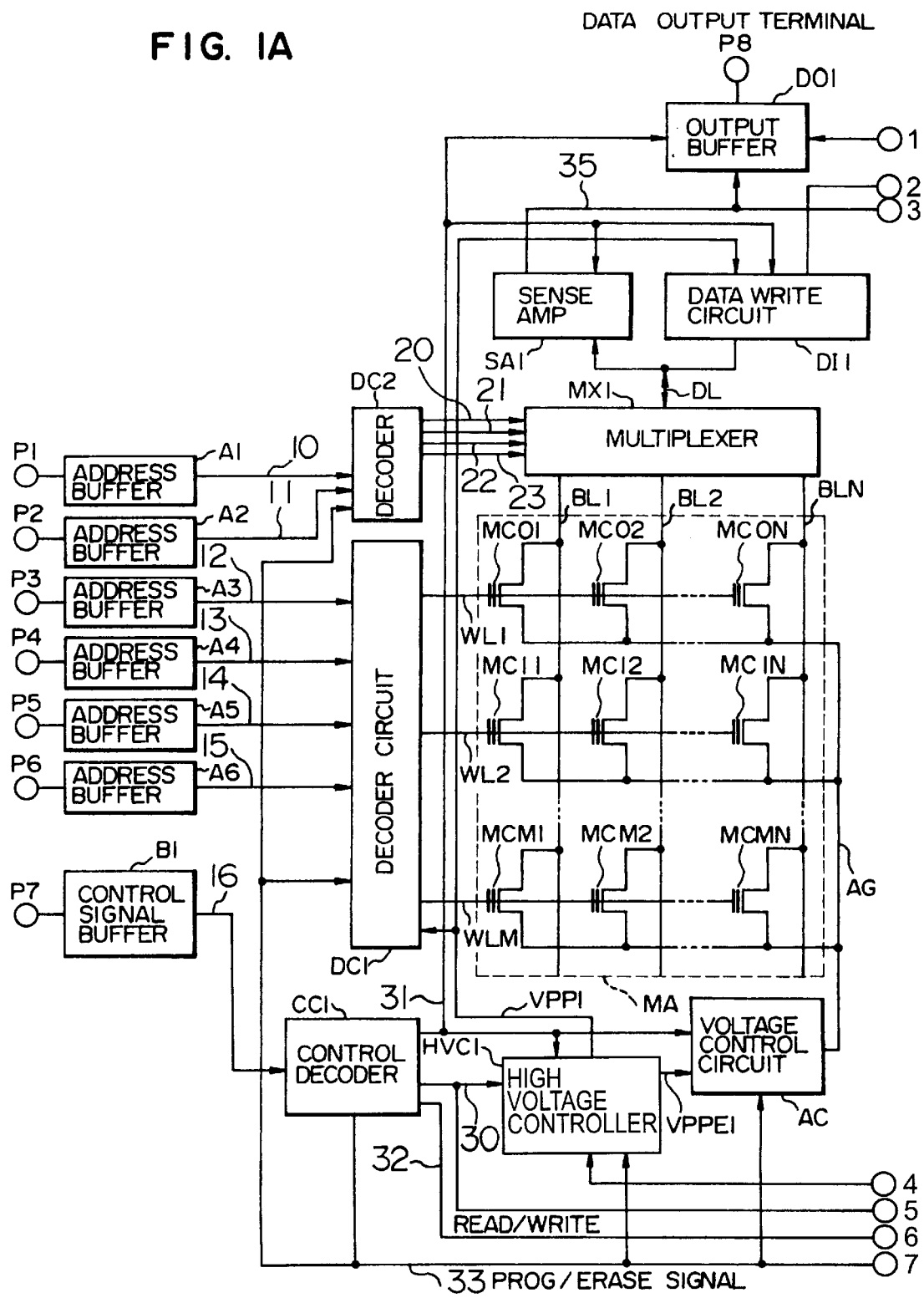
FIGS. 1A and 1B are respectively diagrams of two different portions of an EEPROM of one embodiment of the present invention.
Figure 1B:
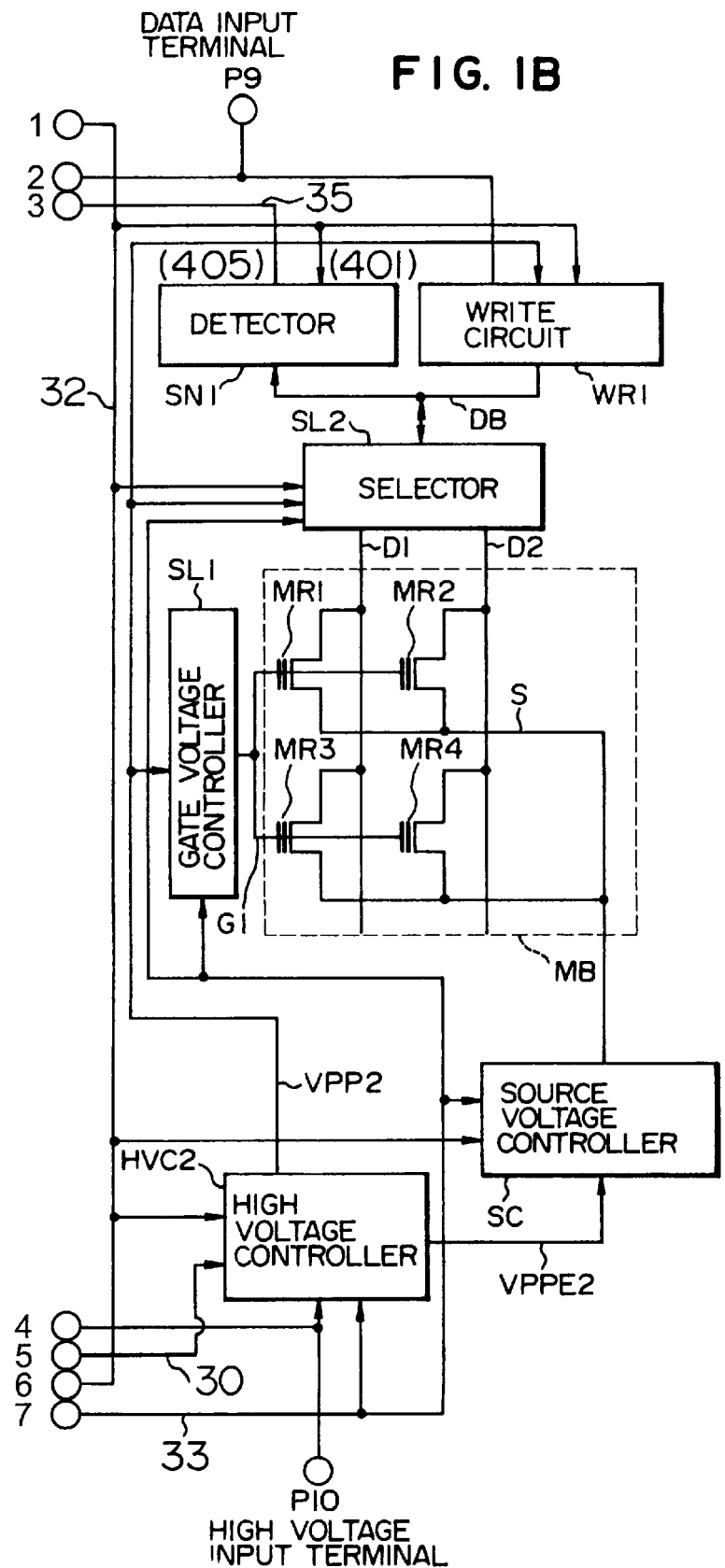
Figure 2:
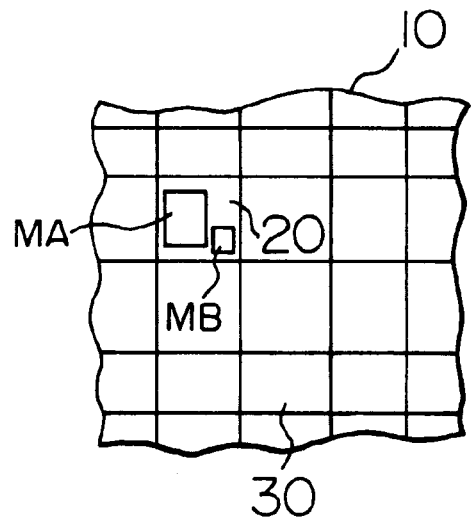
FIG. 2 is a diagram of one example of the arrangement of MA and MB for forming the EEPROM of FIGS. 1A and 1B on a single chip.

One embodiment of the invention will be described with reference to the accompanying drawings. The drawing of the EEPROM according to this invention is divided into two parts and these parts are respectively shown in FIGS. 1A and 1B because of a limited size of the drawing sheet. Thus, the lines designated by circled numbers 1, 2, 3, 4, 5, 6 and 7 in FIG. 1A are connected to the lines of the same numbers in FIG. 1B. In FIG. 1A, memory cells MC01, MC02, . . . MCM1, MCM2 . . . MCMN are arrayed in a matrix shape to form a memory portion MA. This memory portion is the proper memory cells of the EEPROM for storing information and has the same structure as in the prior art. The memory cells have substantially the same function and quality. In FIG. 1B, memory cells MR1, MR2, . . . MR4 are arrayed in a matrix shape to form another memory portion MB. This memory portion MB is added for test according to this invention. While this embodiment has its memory portion MB formed of four memory cells, the number of cells for test is not limited to 4, but may be one or more less than that of the cells of the memory portion MA. The memory cells of the memory portion MA are formed on one of the chips 20 which are cut away from a single semiconductor wafer 10 as shown in FIG. 2. Thus, since all the memory cells are formed on one chip obtained from the wafer 10, they have substantially the same function and the same quality concerning deterioration and reliability characteristics. The memory cells of the memory portion MB are selected to have substantially the same function and the same quality of specific properties as those of the memory portion MA. Therefore, the memory portions MB and MA are preferably formed on one of the chips 20 that are cut away from the same wafer 10. Under some condition, the memory portions MA and MB may be respectively formed on different chips 20 and 30 which are cut away from the same wafer 10.

FIG. 1A shows the memory means which includes, as a main part, the memory portion MA, and FIG. 1B shows the test means which includes, as a main part, the testing memory portion MB. The test means has a test circuit SN1, a write circuit WR1 which is an essential part of the voltage applying means, a gate voltage control circuit SL1 for controlling the gate voltage at the time of writing and detection, a source voltage control circuit SC for controlling the source voltage at the time of writing and detection, a selection circuit SL2 for selecting one of the operating conditions (reading, programming and erasing) of the memory portion MB including the second memory cells, and a high voltage control circuit HVC2 for supplying a high voltage to the write circuit 1, the gate voltage control circuit SL1, the source voltage control circuit SC and the selection circuit SL2. In FIGS. 1A and 1B, P1 through P6 represent address input terminals, P7 a control signal input terminal, P8 a data output terminal, P9 a data input terminal, and P10 a high voltage input terminal. By applying data and address from outside to the EEPROM of this embodiment, it is possible to write the data into or read out the written data from the memory cell which is determined by the address.

The address input terminals P1, P2, P3, P4, P5 and P6 are connected to address buffers A1, A2, A3, A4, A5 and A6, respectively. The outputs 10, 11 from the address buffers A1 and A2 are connected to a decoder circuit DC2, and the outputs 12, 13, 14, 15 from the address buffers A3 through A6 are connected to a decoder circuit DC1. The decoder circuit DC1 selects one of the output signals WL1, WL2, . . . WLM and inhibits (non-select condition) the other output signals according to the signals 12, 13, 14, 15. A control signal 33 is supplied to the decoder circuit DC1, for inhibiting all the output signals. The decoder circuit DC1 has 16 outputs (word lines) WL1, WL2, . . . WLM. The outputs WL1, WL2, ... WLM are connected to the control gates of the memory cells.

Figure 3A:
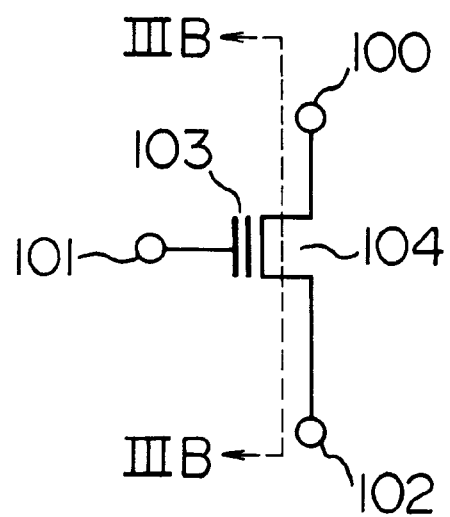
FIG. 3A is a diagram of a MOS memory cell.
Figure 3B:
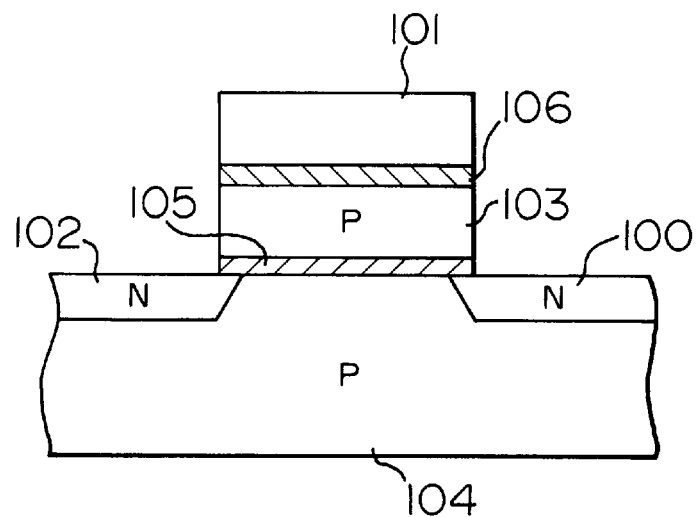
FIG. 3B is a cross-sectional view of the memory cell taken along a line IIIB—IIIB in FIG. 3A.

The memory portion MA of the EEPROM includes first memory cells of MC01, MC02, ..., MC0N; MC11, MC12, ... MC1N; ... and MCM1, MCM2, ... MCMN. FIG. 3A shows one example of the structure of each of the memory cells of MOS type. The structure shown in FIG. 3A corresponds to an equivalent circuit of a semiconductor MOS type memory cell. This semiconductor memory has a drain 100, a control gate 101, a source 102, a floating gate 103 and a semiconductor substrate 104 as illustrated in FIG. 3A. FIG. 3B is a cross-sectional view of the memory cell of FIG. 3A. The semiconductor substrate 104 is of P-type, and the drain 100 and source 102 are formed by diffusing N-type impurities in the surface of the substrate. The control gate 101 and floating gate 103 are made of P-type polysilicon. A thin insulating film 105 (for example, 5 through 15 nm thick) is formed between the P-type substrate 104 and the P-type polysilicon 103 and between the drain 100 and the source 102. The thin insulating film is made of, for example, a silicon thermal oxide film or nitride film. An interlayer insulting layer 106 is formed between the floating gate 103 and the control gate 101, for electrically separating the floating gate 103 from the control gate 101. The interlayer insulating film 106 is also made of, for example, a silicon thermal oxide film or nitride film like the thin insulating film 105.

The word line WL1 in FIG. 1A is electrically connected to the control gate 101 of FIG. 3A, the drain 100 of FIG. 3A is connected to the bit line BL1 of FIG. 1A, and the source 102 is connected to the source line AG. In FIG. 1A, the bit line BL1 is connected to the drains of the memory cells MC01, MC11, ... MCM1, and the bit line BL2 is connected to the drains of the memory cells MC02, MC12, ..., MCM2. Similarly, the bit line BLN is connected to the drains of the memory cells MC0N, MC1N, ..., MCMN. The source line AG is connected to the sources of the memory cells included in the memory portion MA.

The decoder circuit DC2 shown in FIG. 1A for selecting one of the bit lines receives the outputs 10, 11 from the address buffers A1, A2 and produces four outputs 20, 21, 22, 23. When the control signal 33 is supplied to the decoder circuit DC2, all the outputs thereof are rendered in non-select condition (for example, all at low (L) level). These outputs from the decoder circuit DC2 are supplied to a multiplexer MX1. The multiplexer MX1 is responsive to these output signals from the decoder circuit DC2 to connect one of the bit lines BL1, BL2, ..., BLN to the data line DL. A sense amplifier SA1 is connected with the data line DL. Upon reading, it amplifies the signal on the DL line and supplies it to a line 35. The output on the line 35 is supplied to an output buffer DO1, which then produces an output at the data output terminal P8n thereby driving the external output load. Upon writing, a data write circuit DI1 receives data (normally to "1" or "0") from the data input terminal P9, and supplies an output signal corresponding to the data to the data line DL. AC represents a circuit for controlling the voltage on the source line AG. This circuit AC causes the source line AG to be grounded in the reading operation and the program mode of writing operation, and the source line AG to be supplied with a predetermined voltage in the erase mode of writing operation. The circuit AC receives control inputs 31, 33 and a high voltage input VPPE1.

The control signal input terminal P7 is connected to a control signal buffer B1, and an output 16 from the buffer B1 is connected to a control decoder circuit CC1. The control decoder circuit CC1 decodes the signal on the output line 16 and produces output signals 30, 31, 32, 33 for use in the EEPROM. The output signal 30 from the control decoder circuit CC1 is a selection signal for selecting any one of the memory portions MA and MB of the EEPROM. The output signal 31 from the control decoder circuit CC1 is a switching signal for switching the memory cells of memory portion MA between the reading and writing operations. The output signal 32 from the decoder circuit CC1 is a switching signal for switching the operation of the memory cells of memory portion MB between the reading and writing operations. The output signal 33 from the decoder circuit CC1 is a switching signal for switching the writing operation between the program mode and the erase mode. The output signal 30 is supplied to high voltage control circuits HVC1, HVC2, the output signal 31 is supplied to the sense amplifier SA1, data writing circuit DI1, output buffer DO1 and circuit AC, the output signal 32 is supplied to detection circuit SN1, write circuit WR1, output buffer DO1 and source voltage control circuit SC, and the output signal 33 is supplied to the high voltage control circuits HVC1, HVC2, circuit AC, source voltage control circuit SC, decoder circuit DC1, selection circuit SL1, decoder circuit DC2 and selection circuit SL2. The high voltage control circuit HVC1 controls voltages on the out puts VPP1, VPPE1 according to the input signals 30, 31, and 33.

Figure 4:
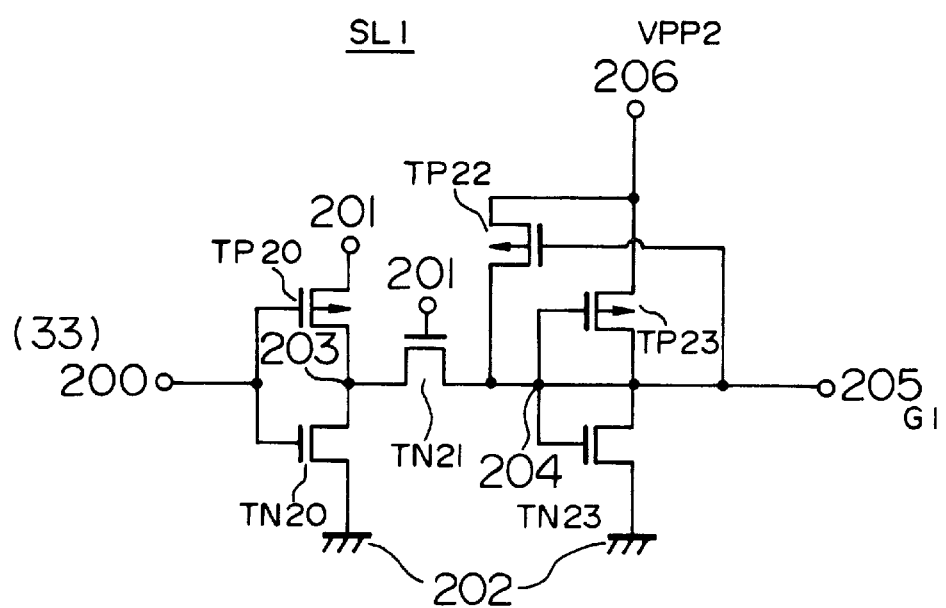
FIG. 4 is a diagram of the gate voltage control circuit of FIG. 1B.

The memory portion MB includes second memory cells MR1, MR2, MR3, MR4. Each memory cell has a structure like that shown in FIGS. 3A and 3B for the MC01. The gate voltage control circuit SL1 controls the control gate voltage of the memory cells of the memory portion MB. This circuit SL1 receives the high voltage signal VPP2 and control signal 33, and produces an output G1, which is connected to the control gates of the MR1, MR2, MR3 and MR4. This circuit SL1 is constructed as shown, for example, in FIG. 4. In FIGS. 4 through 9, TP20, TP21, TP23, ..., TPxx (xx is an arbitrary number) represent P-channel enhancement MOS transistors, and TN20, TN21, TN22, ..., TNxx represent N-channel enhancement MOS transistors. In FIGS. 4 through 9, IVxx represents a logic inverting circuit, INRxx a logical sum inverting circuit, and INDxx a logical product inverting circuit. In FIG. 4, a terminal 200 is connected to the output line 33 shown in FIGS. 1A and 1B, a terminal 206 is connected to the output line VPP2 shown in FIGS. 1A and 1B, and a terminal 205 is connected to the output line G1 shown in FIG. 1B. In the memory portion MB, line D1 is connected to the drains of the memory cells MR1, MR3, line D2 is connected to the drains of the memory cells MR2, MR4, and line S is connected to the sources of the memory cells MR1, MR2, MR3, MR4.

Figure 5:
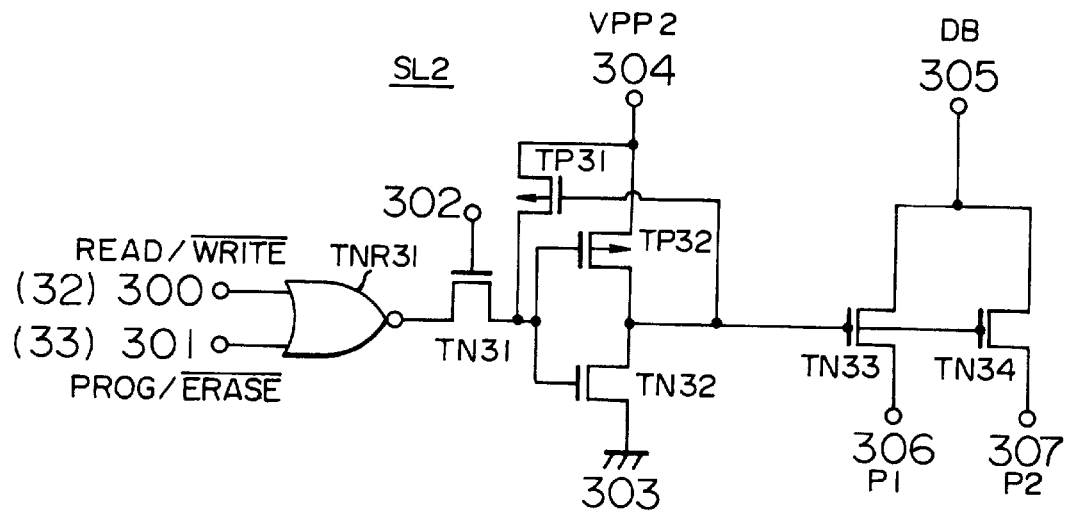
FIG. 5 is a diagram of the selection circuit of FIG. 1B.

The selection circuit SL2 selects one of the lines D1 and D2, which is electrically connected to the output line DB. This selection circuit SL2 receives control signals 32, 33 and is high voltage VPP2, and constructed as shown, for example, in FIG. 5. In FIG. 5, a terminal 300 is connected to the line 32 shown in FIGS. 1 and 2, a terminal 301 is connected to the line 33 shown in FIGS. 1A and 1B, and terminals 304, 305, 306 and 307 are connected respectively to lines VPP2, DB, D1 and D2 shown in FIGS. 1 and 2.

Figure 6:
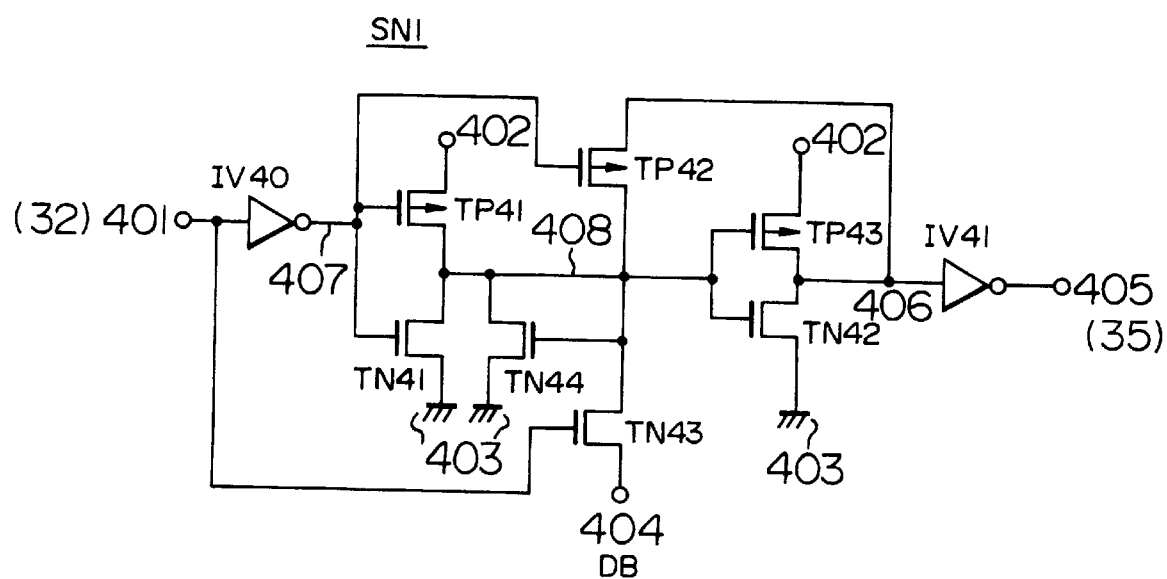
FIG. 6 is a diagram of the detection circuit of FIG. 1B.

The detection circuit SN1 shown in FIG. 2 receives the signal DB and produces a high or low level of the signal DB on an output line 35. This detection circuit SN1 is constructed as shown, for example, in FIG. 6. In FIG. 6, a terminal 401 is connected to the control signal 32 shown in FIGS. 1A and 1B, and terminals 404 and 405 are connected respectively to the lines DB and 35 shown in FIGS. 1A and 1B.

Figure 7:
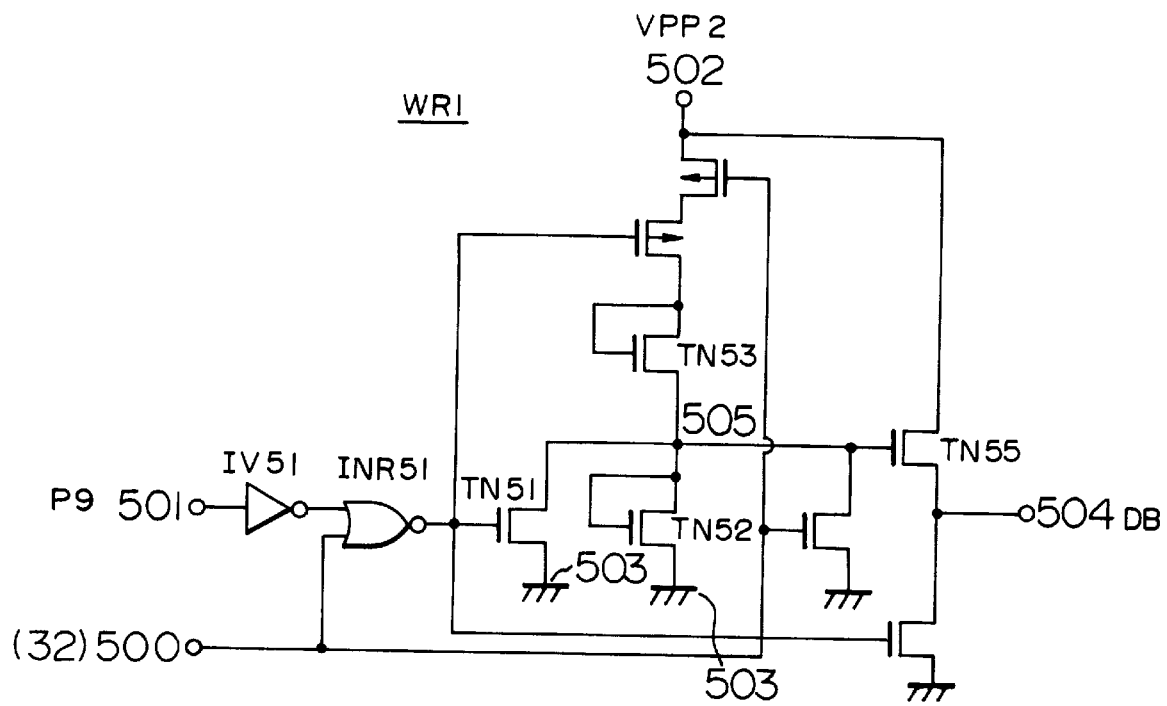
FIG. 7 is a diagram of the write circuit of FIG. 1B.

The write circuit WR1 shown in FIG. 1B receives information that is to be written in the memory portion MB from the data input terminal P9 and converts it into a write voltage which is produced on the output line DB. This write circuit WR1 is controlled by the signal 32, and constructed as shown, for example, in FIG. 7. In FIG. 7, a terminal 501 is connected to the terminal P9 shown in FIGS. 1A and 1B, a terminal 500 is connected to the control signal 32 shown in FIGS. 1A and 1B, and terminals 502 and 504 are connected to the lines VPP2 and DB shown in FIGS. 1A and 1B.

Figure 8:
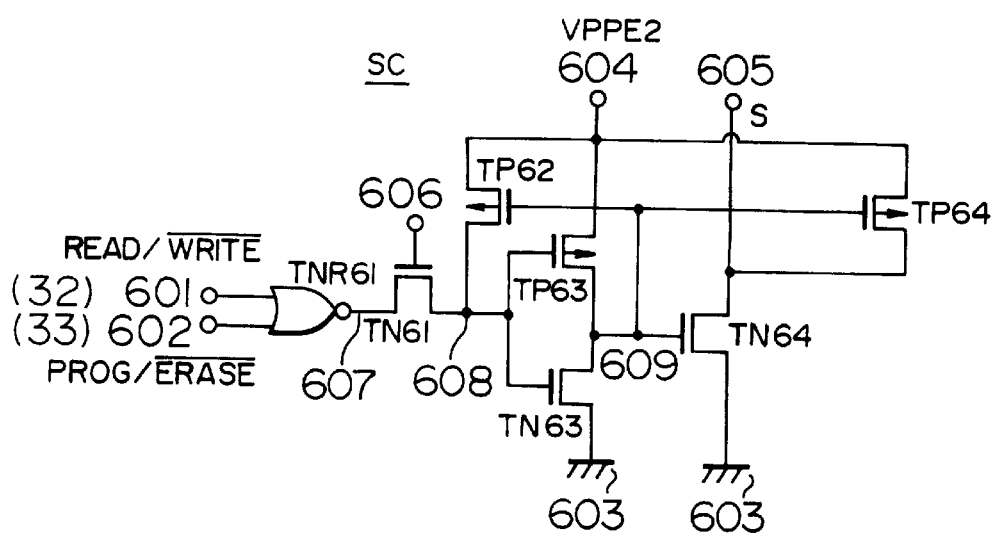
FIG. 8 is a diagram of the source voltage control circuit of FIG. 1B.

The source voltage control circuit SC shown in FIG. 1B controls the source voltage for the memory cells of the memory portion MB in accordance with the control signal 33. This source voltage control circuit is connected to the lines VPPE2 and S, and constructed as shown, for example, in FIG. 8. In FIG. 8, a terminal 601 is connected to the line 32 shown in FIGS. 1A and 1B, a terminal 602 is connected to the line 33 shown in FIGS. 1A and 1B, and terminals 604 and 605 are connected respectively to the lines VPPE2 and S shown in FIGS. 1A and 1B.

Figure 9:
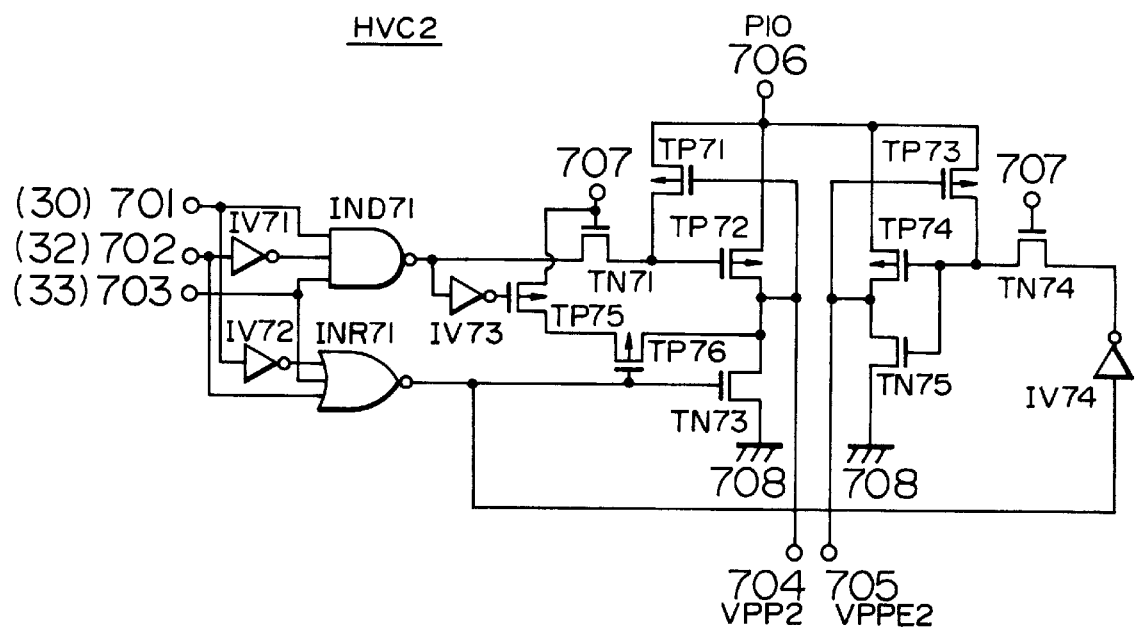
FIG. 9 is a diagram of the high-voltage control circuit of FIG. 1B.

The high voltage control circuit HVC2 shown in FIG. 1B controls the high voltages for writing the memory portion MB. This circuit receives a high voltage from the high voltage input terminal P10 and produces outputs on the lines VPP2 and VPPE2 according to control signals 30, 32, 33. This circuit is constructed as shown, for example, in FIG. 9. In FIG. 9, a terminal 701 is connected to the line 30 shown in FIGS. 1A and 1B, a terminal 702 is connected to the line 32 shown in FIGS. 1A and 1B, a terminal 703 is connected to the line 33 shown in FIGS. 1A and 1B, and terminals 706, 704, 705 are connected to the terminal P10 and lines VPP2, VPPE2 shown in FIGS. 1A and 1B.

The operation of this embodiment will be described below. The operation conditions of the memory cells of the memory portions MA and MB and the voltages at the respective terminals are listed in Table 1.

TABLE 1

OPERATING CONDITIONS AND VOLTAGES IN MEMORY CELLS

| Terminals | Drain | Control gate | Source | Memory cell Threshold value |
|---|---|---|---|---|
| Read (Detection) | 1–2 V | 5 V | 0 V | 1–3 V or 6–9 V |
| Write | | | | |
| Program | 6–9 V | 10–20 V | 0 V | 6–9 V |
| Erase | Open | 0 V | 10–20 V | 1–3 V |

When reading, the source terminals are grounded, a voltage of 1–2V is applied to the drain terminals, and a voltage of 5V is applied to the control gates. The threshold value of the memory cell depends on the amount of electric charge on the floating gate. When the threshold value after programming is 6–9V, the memory cells are not turned on when reading, and no current flows between the drain and the source. However, when the threshold value after erasing is a voltage of 1 through 3V, the memory cell is turned on, and current (for example, 30 through 100 $\mu A$ (microampares) flows between the drain and the source. Thus, the recorded information corresponding to the threshold value can be detected by detecting the variation of the bit line voltage due to the change of this amount of current.

The writing operation includes the programming mode and the erasing mode. In the programming mode, a conductive channel is provided under the gate of a memory cell by applying, for example, a voltage of 6 through 9V to the drain, a voltage of 10 through 20V to the control gate and 0V to the source (or grounded). As a result, electrons having high energy within the channel are injected beyond the energy barrier of the thin oxide film into the floating gate (called the channel hot electron injection). Since electrons are accumulated on the floating gate, the threshold value of the control gate voltage is increased. In the erase mode, an electric field, strong enough to cause the tunnel phenomenon between the floating gate and the source is induced by, for example, making the drain open, and applying a voltage of 10 through 20V to the source and 0V to the control gate to extract electrons from the floating gate. At this time, since electrons and holes are passed through the oxide film, the electrons and holes are trapped at the trapping energy level in the oxide film.

Figure 10:
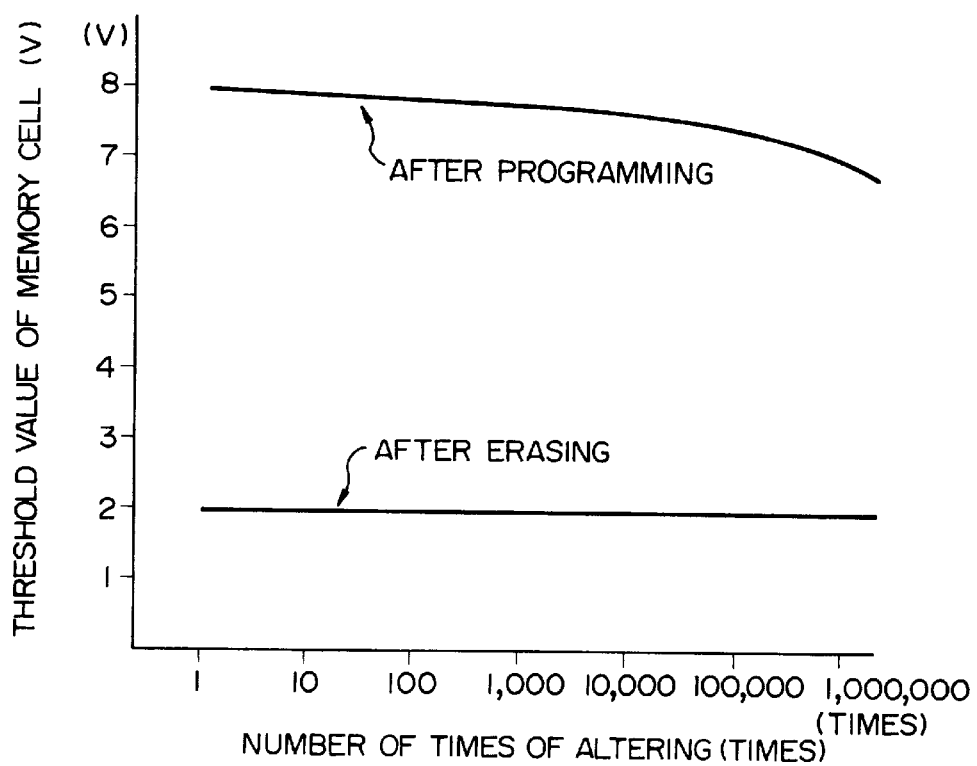
FIG. 10 is a graph showing the relation between the number of times of altering memory cells and the threshold value after programming (writing) and erasing in the embodiment of the present invention.

When the altering operation is repeated, the electrons and holes trapped in the oxide film affect the threshold value, so as to reduce the difference between the highest and lowest threshold levels. In addition, an excessively high electric field is applied locally to the oxide film because of the presence of the trapping energy level, thus locally destroying the oxide film to reduce its insulating property. This is described in detail in Document 1. Thus, the threshold value of the memory cell is changed according to the number of times of altering as shown, for example, in FIG. 10. In FIG. 10, the abscissa is the number of times of altering, and the ordinate is the threshold value.

A description will be made of the operation for electrically altering the memory cells of the memory portion MB. In the programming mode, first a voltage of, for example, 10 through 20V is applied to the high voltage input terminal P10. Then a program instruction to the memory portion MB is supplied to the control input terminal P7, and simultaneously write data is supplied to the data input terminal P9. The instruction is decoded by the control signal decoder circuit CC1 so that the output lines or signals 30, 31, 32 and 33 are made high (H), high (H), low (L) and high (H), respectively. When the signal 30 is H, the high voltage control circuit HVC1 is inoperative, and the high voltage control circuit HVC2 is operative. FIG. 9 shows a specific example of the high voltage control circuit HVC2. When signals of H, L and H levels are respectively applied to terminals 701 (=30), 702 (=32), and 703 (=33), a high voltage and 0V are respectively produced at the terminals 704 (=VPP2) and 705 (=VPPE2). In FIG. 9, terminal 707 is at the power supply voltage (for example, 5V), and terminal 708 is at ground potential (0V).

TABLE 2

LOGIC TABLE OF HIGH VOLTAGE CONTROL CIRCUIT

| Nodes | 701 Switching | 702 Read/ Write | 703 Program/ Erase | 704 VPP2 | 705 VPPE2 | Modes |
|---|---|---|---|---|---|---|
| Logic States | H | L | L | 0V | VPP | Erase |
| | H | H | H | VPP | 0V | Program |
| | H | H | L | VCC | 0V | |
| | H | H | H | VCC | 0V | Read |
| | L | L | L | VCC | 0V | |
| | L | L | H | VCC | 0V | |
| | L | H | L | VCC | 0V | |
| | L | H | H | VCC | 0V | |

Table 2 is provided to facilitate understanding of the logic diagram of FIG. 9. In Table 2, VPP is the high voltage, and VCC is the power supply voltage. When the signal 33 is H, the output G1 of the gate voltage control circuit SL1 is a high voltage (for example, 10 through 20V) as shown in FIG. 4. In FIG. 4, 201 is at the power supply voltage, and 203 is at ground potential. When the signal 32 is L, the detection circuit SN1 is inoperative because the input DB cannot be detected as shown in FIG. 6, and instead the write circuit WR1 is operative. In the write circuit shown in FIG. 7, when the terminal 500 (=32) is H, the output 504 (=DB) has a high impedance. When the terminal 500 is L, the terminal 504 is L, when the terminal 501 (=P9) is H while the terminal 504 (DB) is at a certain voltage (for example, 6 through 9V) corresponding to a fraction of the voltage at the terminal 502 (=VPP2) when the terminal 501 is L. In FIGS. 6 and 7, terminals 402 and 409 are at the power supply voltage, and lines 403 and 503 are at ground potential. When the signal 33 is H, the signal DB to the selection circuit SL2 is fed to the lines D1, D2 connected to the circuit SL2 as shown in FIG. 5. Thus, a predetermined voltage (6 through 9V) is applied to the lines D1, D2. By the above operation, it is possible to program the memory cells MR1 and MR2 of the memory portion MB.

In the erase mode for the memory portion MB, a high voltage, for example, 10 through 20V is applied to the high voltage input terminal P10, and an erase instruction to the memory portion MB is applied to the control signal input terminal P7. The instruction is decoded by the control signal decoder circuit CC1 so that the output lines 30, 31, 32 and 33 are at H, H, L and L levels, respectively. At this time, since the input terminals 701 (=30), 702 (=32) and 703 (=33) of the high voltage control circuit HVC2 are respectively at H, L and L, the terminals 704 (=VPP2) and 705 (=VPPE2) are respectively at 0V and a high voltage (for example, 10 through 20V). In the source voltage control circuit SC, since each of the input terminals 601 (=32) and 602 (=33) is at L as shown in FIG. 8, the terminal 605 (=S) is connected to the terminal 604 (=VPPE2) and thus placed at a high voltage. In FIG. 8, the terminal 606 is at the power supply voltage, and line 603 is grounded. In the gate voltage control circuit SL1, since the input terminal 200 (=33) is L, the terminal 205 (=G1) is 0V. In the section circuit SL2, since each of the terminals 300 (=32) and 301 (=33) is at L, the transistors TN33 and TN34 are turned off so that the terminal 305 (=DB) is not connected to the terminals 306 (=D1) and 307 (=D2). Therefore, by the above operation, it is possible to erase the memory cells MR1, MR2, MR3 and MR4 of the memory portion MB.

To detect the threshold value of the memory cells of the memory portion MB, a detection instruction to the memory portion MB is applied to the terminal P7. The control signal decoder circuit CC1 decodes the instruction so that the output lines 30, 32 and 33 are respectively at H, H and H. Thus, the output VPP2 of the high voltage control circuit HVC2 is at the power supply voltage. In addition, since the transistor TN64 of the source voltage control circuit SC, as shown in FIG. 8, is turned on, the signal S is 0V. The output G1 of the gate voltage control circuit SL1 is H (power supply voltage). Thus, the transistors TN33 and TN34 of the selection circuit SL2 are turned on so that the line DB is connected to the lines D1 and D2. The write circuit WR1 is inoperative since the terminal 500 (=32) is at H. In the detection circuit SN1, since the terminal 401 (=32) is at H, the terminal 408 is at a predetermined voltage (for example, 1.5V) which is substantially determined by the on-resistance ratio between the transistors TP41 and TN44.

When the threshold value of the memory cell is lower than the voltage of G1, the memory cell is turned on so that a current path is established from the terminal 402 (power supply voltage) through the transistors TP41, TN43, lines D1, D2 to the line S. At this time, the voltage on the line 408 is somewhat reduced (for example, 1.0). The potential difference can be amplified and detected by the transistors TP43 and TN42. In other words, when the memory cell is turned on, the terminal 405 (=35) is L. When the memory cell is off, the terminal 405 is H. The signal at the terminal 405 is supplied through the output buffer DO1 to the data output terminal P8. Moreover, the reduction of the threshold value due to the deterioration of the memory cell can be detected by adjusting the power supply voltage to change the voltage at G1 and finding the range of the value of G1 at which the memory cell is on.

It will be easily understood that the reading and writing of the memory portion MA can be performed in the same way.

The memory cells of the memory portions MA and MB shown in FIGS. 1A and 1B are formed in the same process, and thus have the same functions and the same quality of deterioration and reliability characteristics. Therefore, the cells are affected to the same extent on the possible number of times of electrical altering thereof by deviation in manufacturing process. Accordingly, the specific quality of the memory portion MA can be predicted by detecting that of the memory cells of the memory portion MB. In other words, the characteristic in deterioration of the memory cells of the memory portion MA due to repetition of electrical altering can be predicted by examining the degree in deterioration of the memory cells of the memory portion MB when the altering cycle of write-read-erase-read has been applied to the memory cells of the memory portion MB repeatedly by the same number of times as that by which the altering cycle will be generally repeated in the conventional test of the memory cells of the read memory portion MA. At the step of the altering cycle, the change of the threshold value is examined to decide the degree of the deterioration. In addition, since the memory cells of the memory portion MA in which information is actually stored are not deteriorated by the test, the number of times by which the memory cells of the memory portion MB are electrically repeatedly altered can be increased to more than that by which the altering cycle is repeated to the memory cells of the memory portion MA in the conventional test. Thus, the characteristic in deterioration of the memory cells of the memory portion MB can be more precisely predicted.

In addition, by making higher the high voltage (5V or above) to be applied to the drain, control gate or source in programming and erasing of the memory portion MB by 1–2 volts than that in the normal use for the memory portion MA, it is possible to accelerate the deterioration of the memory cells of the memory portion MB thereby reducing the number of altering cycles for the test to less than that by in which the memory cells of the memory portion MA are repeatedly altered in the conventional test. Moreover, since the number of the memory cells of the memory portion MB is less than that of the memory portion MA, it is possible to greatly reduce the time necessary for the test for predicting the characteristic in deterioration of the memory cells of the memory portion MA by electrical altering, or the test for predicting the possible number of times of electrical altering for the memory cells.

While a single memory portion MB is used in this embodiment, a plurality of memory portions MB may be used. In addition, the number of address terminals, the number of control signal terminals, the number of data output terminals, and the number of data input terminals can be easily increased according to this embodiment.

In addition, while in this embodiment a high voltage is applied to the high voltage input terminal from the outside of the EEPROM, the high voltage may be produced, instead of providing the high voltage terminal, by boosting the power supply voltage within the EEPROM.

Moreover, while in this embodiment the memory cell has the thin insulating film and the floating gate, the memory cell may have any structure provided that it can be electrically altered and has a property that its quality is deteriorated by the altering. For example, in place of the structure having the thin oxide film and the floating gate, a nitride film may be used. Also, this invention is not limited to the semiconductor memory cell, but may be applied to a ferrodielectric film.

In addition, this invention is not limited to the EEPROM which requires a high voltage for altering the memory cells. Also, the EEPROM according to this invention may be combined with other devices or apparatus.

According to this invention, since the second memory cells are provided exclusively for the assurance of altering in order to assure the possible number of times of electrical altering for the memory cells which are electrically alterable by a limited number of times, the first memory cells to be actually used by the user are not deteriorated by the altering test.

Also, according to this invention, by making higher the voltage which the tunnel phenomenon is caused for erasing thereby to accelerate the deterioration, it is possible to conduct the altering test effectively in a short time, and reduce greatly the cost for the test.

Moreover, since the second memory cells are provided exclusively for assuring the electric altering, the time for the altering test can be decreased. If, for example, this invention is applied to the EEPROM having a capacity of one megabit and the second memory cells of 10 bytes are provided, the time necessary for 1000-time erasing (the programming time necessary before erasing is neglected) is 10 seconds while in the prior art it is about 90 seconds. As a result, if the test cost is, for example, 0.5 yens per second, the test cost in this invention is indeed 440 yens.

What is claimed is:

1. An electrically alterable nonvolatile semiconductor memory device comprising:

a first memory including a plurality of first memory cells having substantially the same specific quality, said first memory cells being arranged in a first matrix of rows and columns;

a second memory including a plurality of second memory cells, each of the second memory cells having substantially the same specific quality as that of said first memory cells, said second memory cells being arranged in a second matrix of plural rows and plural columns, said second memory being provided for predicting life duration of said first memory from variation of the specific quality of the second memory cells resulting from altering contents of said second memory, wherein the number of rows and columns of said second matrix is less than that of the rows and columns of the first matrix;

first control means for writing data into, reading data out of and erasing data of said first memory;

second control means for writing data into, reading data out of and erasing data of said second memory, said second control means including acceleration means for accelerating the deterioration of said second memory;

means for selecting one of said first control means and said second control means so that only the selected one of said first control means and said second control means operates at a time to alter the contents of the associated memory; and means for detecting variation of the specific quality of said second memory cells by repeatedly altering the contents of said second memory by selecting said second control means;

whereby the life duration of the first memory is estimated from the detected variation of the specific quality of the second memory.

2. An electrically alterable nonvolatile semiconductor memory device according to claim 1, wherein the specific quality of the first and second memory cells is a threshold voltage degradation characteristic of the memory cells and the variation of the specific quality of the second memory cells is a degradation of the threshold voltage of the second memory cells due to altering of the contents of the second memory.

3. An electrically alterable nonvolatile semi-conductor memory device according to claim 2, wherein a voltage condition which is supplied to the second memory by the second control means when the contents of the second memory are to be altered is substantially the same as a voltage condition which is supplied to the first memory when the contents of the first memory are to be altered.

4. An electrically alterable nonvolatile semiconductor memory device according to claim 3, wherein the first and second memory cells are MOS-type semiconductor elements and the voltage condition is a condition of voltages which are applied to drain, gate and source of each MOS-type semiconductor element.

5. An electrically alterable nonvolatile semiconductor memory device according to claim 1, wherein the specific quality of each second memory cell is varied by a voltage condition supplied by the second control means to the second memory at a higher rate than that at which the specific quality of each first memory cell is varied by a voltage condition supplied by the first control means to the first memory.

6. An electrically alterable nonvolatile semiconductor memory device according to claim 5, wherein the first and second memory cells are MOS-type semiconductor elements and the voltage condition is a condition of voltages which are applied to drain, gate and source of each MOS-type semiconductor element.

7. An electrically alterable nonvolatile semiconductor memory device according to claim 1, wherein the first and second memory cells are formed on a single chip.

8. An electrically alterable nonvolatile semiconductor memory device according to claim 1 wherein the first and second memory cells are respectively formed on different chips obtained from a single wafer.

9. An electrically alterable nonvolatile semiconductor memory device according to claim 1, wherein said acceleration means applies to said second memory a voltage higher than a voltage applied to said first memory by said first control means.

10. An electrically alterable nonvolatile semiconductor memory device according to claim 1, wherein in writing and erasing of said second memory, said acceleration means applies to a drain, a control gate and a source of said second memory voltages higher than voltages applied to a drain, a control gate and a source of said first memory in writing and erasing of said first memory.

11. An electrically alterable nonvolatile semiconductor memory device comprising:

a first memory including a plurality of first memory cells having substantially the same specific quality, said first memory cells being arranged in a first matrix of rows and columns;

a second memory including a plurality of second memory cells, each of the second memory cells having substantially the same specific quality as that of said first memory cells, said second memory being arranged in a second matrix of plural rows and plural columns, said second memory being provided for predicting life duration of said first memory from variation of the specific quality of the second memory cells resulting from altering contents of said second memory;

first control means for writing data into, reading data out of and erasing data of said first memory;

second control means for writing data into, reading data out of and erasing data of said second memory, said second control means including acceleration means for accelerating the deterioration of said second memory;

means for selecting one of said first control means and said second control means so that only the selected one of said first control means and said second control means operates at a time to alter the contents of the associated memory; and means for detecting variation of the specific quality of said second memory cells by repeatedly altering the contents of said second memory by selecting said second control means;

whereby the life duration of the first memory is estimated from the detected variation of the specific quality of the second memory.

12. An electrically alterable nonvolatile semiconductor memory device according to claim 11, wherein the specific quality of the first and second memory cells is a threshold voltage degradation characteristic of the memory cells and the variation of the specific quality of the second memory cells is a degradation of the threshold voltage of the second memory cells due to alteration of the contents of the second memory.

13. An electrically alterable nonvolatile semiconductor memory device according to claim 12, wherein a voltage condition which is supplied to the second memory by the second control means when the contents of the second memory are to be altered is substantially the same as a voltage condition which is supplied to the first memory when the contents of the first memory are to be altered.

14. An electrically alterable nonvolatile semiconductor memory device according to claim 13, wherein the first and second memory cells are MOS-type semiconductor elements and the voltage condition is a condition of voltages which are applied to drain, gate and source of each MOS-type semiconductor element.

15. An electrically alterable nonvolatile semiconductor memory device according to claim 11, wherein the specific quality of each second memory cell is varied by a voltage condition supplied by the second control means to the second memory at a higher rate than that at which the specific quality of each first memory cell is varied by a voltage condition supplied by the first control means to the first memory.

16. An electrically alterable nonvolatile semiconductor memory device according to claim 15, wherein the first and second memory cells are MOS-type semiconductor elements and the voltage condition is a condition of voltages which are applied to drain, gate and source of each MOS-type semiconductor element.

17. An electrically alterable nonvolatile semiconductor memory device according to claim 11, wherein the first and second memory cells are formed on a single chip.

18. An electrically alterable nonvolatile semiconductor memory device according to claim 11, wherein the first and second memory cells are respectively formed on different chips obtained from a single wafer.

19. An electrically alterable nonvolatile semiconductor memory device according to claim 11, wherein said acceleration means applies to said second memory a voltage higher than a voltage applied to said first memory by said first control means.

20. An electrically alterable nonvolatile semiconductor memory device according to claim 11, wherein in writing and erasing of said second memory, said acceleration means applies to a drain, a control gate and a source of said second memory voltages higher than voltages applied to a drain, a control gate and a source of said first memory in writing and erasing of said first memory.

21. An electrically alterable nonvolatile semiconductor memory device comprising:

a first memory means including a plurality of first memory cells having substantially the same specific quality, said first memory cells being arranged in a first matrix of rows and columns;

a second memory means including a plurality of second memory cells, a number of which is less than the number of said first memory cells, each of the second memory cells having substantially the same specific quality as that of said first memory cells, said second memory cells being arranged in a second matrix of plural rows and plural columns, said second memory means being provided for predicting life duration of said first memory means from variation of the specific quality of the second memory cells resulting from altering contents of said second memory means;

first control means for writing data into, reading data out of and erasing data of said first memory means;

second control means for writing data into, reading data out of and erasing data of said second memory means, said second control means including acceleration means for accelerating the deterioration of said second memory;

selection means for selecting one of said first control means and said second control means so that only the selected one of said first control means and said second control means operates at a time to alter the contents of the associated memory means; and an examination means for examining a variation of the specific quality of each of the second memory cells resulting from altering the contents of the second memory means by selecting said second control means by said selection means;

whereby the life duration of the first memory means is estimated from the examined variation of the specific quality of each of the second memory cells.

22. An electrically alterable nonvolatile semiconductor memory device according to claim 21, wherein the specific quality of the first and second memory cells is a threshold voltage degradation characteristic of the memory cells and the variation of the specific quality of the second memory cells is a degradation of the threshold voltage of the second memory cells due to altering of the contents of the second memory.

23. An electrically alterable nonvolatile semiconductor memory device according to claim 22, wherein a voltage condition which is supplied to the second memory means by the second control means when the contents of the second memory means are being altered is substantially the same as a voltage condition which is supplied to the first memory means when the contents of the first memory means are being altered.

24. An electrically alterable nonvolatile semiconductor memory device according to claim 23, wherein the first and second memory cells are MOS-type semiconductor elements and the voltage condition is a condition of voltages which are applied to drain, gate and source of each MOS-type semiconductor element.

25. An electrically alterable nonvolatile semiconductor memory device according to claim 21, wherein the specific quality of each second memory cell is varied by a voltage condition supplied to the second memory means by the second control means at a higher rate than that at which the specific quality of each first memory cell is varied by a voltage condition supplied to the first memory means by the first control means.

26. An electrically alterable nonvolatile semiconductor memory device according to claim 25, wherein the first and second memory cells are MOS-type semiconductor elements and the voltage condition is a condition of voltages which are applied to drain, gate and source of each MOS-type semiconductor element.

27. An electrically alterable nonvolatile semiconductor memory device according to claim 21, wherein the first and second memory cells are formed on a single chip.

28. An electrically alterable nonvolatile semiconductor memory device according to claim 21, wherein the first and second memory cells are respectively formed on different chips obtained from a single wafer.

29. An electrically alterable nonvolatile semiconductor memory device according to claim 21, wherein said acceleration means applies to said second memory a voltage higher than a voltage applied to said first memory by said first control means.

30. An electrically alterable nonvolatile semiconductor memory device according to claim 21, wherein in writing and erasing of said second memory, said acceleration means applies to a drain, a control gate and a source of said second memory voltages higher than voltages applied to a drain, a control gate and a source of said first memory in writing and erasing of said first memory.

* * * * *